US009478998B1

(12) United States Patent
Lapetina et al.

(10) Patent No.: US 9,478,998 B1
(45) Date of Patent: Oct. 25, 2016

(54) WATERPROOF MICRO-USB RECEPTACLE

(71) Applicant: Verily Life Sciences LLC., Mountain View, CA (US)

(72) Inventors: John Lapetina, Los Altos Hills, CA (US); Russell Norman Mirov, Los Altos, CA (US)

(73) Assignee: Verily Life Sciences LLC, Mountain View, CA (US)

( * ) Notice: Subject to any disclaimer, the term of this patent is extended or adjusted under 35 U.S.C. 154(b) by 159 days.

(21) Appl. No.: 14/485,637

(22) Filed: Sep. 12, 2014

(51) Int. Cl.
*H01R 13/6594* (2011.01)
*H01R 13/6581* (2011.01)
*H02J 7/00* (2006.01)

(52) U.S. Cl.
CPC ............ *H02J 7/0042* (2013.01); *H02J 7/0052* (2013.01)

(58) Field of Classification Search
CPC ...... H02J 7/0042; H02J 7/0052; H01R 9/03; H01R 13/5202; H01R 13/6581; H01R 13/6594
USPC ............ 439/607.57, 607.58, 607.07, 607.09, 439/607.11, 607.13, 607.14, 607.2, 607.32, 439/607.33, 607.35, 607.4, 607.51, 620.12, 439/620.15, 620.16, 538, 909, 271, 278, 439/559, 589, 620.18, 620.23; 600/384, 600/394
See application file for complete search history.

(56) References Cited

U.S. PATENT DOCUMENTS

| | | | | |
|---|---|---|---|---|
| 4,571,199 | A * | 2/1986 | Murakami | G04B 37/0008 446/135 |
| 7,922,535 | B1 * | 4/2011 | Jiang | H01R 13/5205 439/271 |
| 8,337,245 | B1 | 12/2012 | Wang et al. | |
| 8,388,380 | B1 | 3/2013 | Van Der Steen | |
| 8,574,001 | B2 * | 11/2013 | Lee | H01R 13/7172 200/313 |
| 8,662,928 | B1 * | 3/2014 | Xie | H01R 13/6594 439/607.35 |
| 8,827,742 | B2 | 9/2014 | Wang | |
| 2010/0331145 | A1 * | 12/2010 | Lakovic | G04F 10/00 482/8 |
| 2013/0152276 | A1 * | 6/2013 | Hsieh | G04G 17/08 2/243.1 |
| 2013/0183844 | A1 | 7/2013 | Wang | |
| 2014/0100432 | A1 * | 4/2014 | Golda | A61B 5/04085 600/301 |
| 2014/0113497 | A1 | 4/2014 | Wang | |

* cited by examiner

*Primary Examiner* — Abdullah Riyami
*Assistant Examiner* — Harshad Patel
(74) *Attorney, Agent, or Firm* — McDonnell Boehnen Hulbert & Berghoff LLP.

(57) ABSTRACT

A device including a housing, a rechargeable battery disposed within the housing, a micro-USB receptacle positioned in the housing, a recharger disposed within the housing and configured to recharge the rechargeable battery, wherein the recharger is configured to be powered through the micro-USB receptacle, wherein the micro-USB receptacle is configured to be waterproof, and includes a metal shell having an exterior surface and a front face extending forwardly from the exterior surface of the metal shell, a layer of plastic overmolded onto the exterior surface of the metal shell, a front face in the layer of plastic that extends around a periphery of the front face of the metal shell, and a seal positioned between the front face of the layer of plastic and an inner surface of the housing.

23 Claims, 8 Drawing Sheets

WATERPROOF MICRO-USB RECEPTACLE

BACKGROUND

Unless otherwise indicated herein, the materials described in this section are not prior art to the claims in this application and are not admitted to be prior art by inclusion in this section.

A wearable device may be mounted to a wrist location or other body location and may include one or more sensors to measure fitness-related data or other physiological data of the wearer. Such wearable devices may include a rechargeable battery and internal electronics including a recharger used for battery recharging. A port, such as a micro-USB receptacle, may be used to connect the wearable device to an external power source for the purpose of battery recharging and other purposes. In addition to wearable devices, micro-USB receptacles are also used on other types of electronic devices such as cell phones, cameras, handheld computers, tablet computers, etc.

Liquid, moisture, and/or the sweat of a user may infiltrate the port or micro-USB receptacle, resulting in the undesirable effect of contaminating or comprising the port. Furthermore, such wearable devices and electronic devices may become immersed in water. Therefore, it would be desirable to provide a wearable device or electronic device having a waterproof micro-USB receptacle.

SUMMARY

In one aspect, a wearable device is provided that includes a housing, a rechargeable battery disposed within the housing, a mount configured to mount the housing to an external body surface, one or more sensors positioned in the housing and configured to measure one or more physiological parameters via the external body surface, a micro-USB receptacle positioned in the housing; and electronics disposed in the housing, wherein the electronics comprises a recharger configured to recharge the rechargeable battery, wherein the recharger is configured to be powered through the micro-USB receptacle, wherein the micro-USB receptacle comprises a metal shell having an exterior surface and a front face extending forwardly from the exterior surface of the metal shell, a layer of plastic overmolded onto the exterior surface of the metal shell, a front face in the layer of plastic that extends around a periphery of the front face of the metal shell, and a seal positioned between the front face of the layer of plastic and an inner surface of the housing.

In another aspect, a device is provided including a housing, a rechargeable battery disposed within the housing, a micro-USB receptacle positioned in the housing, a recharger disposed in the housing and configured to recharge the rechargeable battery, wherein the recharger is configured to be powered through the micro-USB receptacle, wherein the micro-USB receptacle comprises, a metal shell having an exterior surface and a front face extending forwardly from the exterior surface of the metal shell, a layer of plastic overmolded onto the exterior surface of the metal shell, a front face in the layer of plastic that extends around a periphery of the front face of the metal shell, and a seal positioned between the front face of the layer of plastic and an inner surface of the housing.

In a further aspect, a wearable device or electronic device is provided including means for providing a waterproof micro-USB receptacle.

These as well as other aspects, advantages, and alternatives, will become apparent to those of ordinary skill in the art by reading the following detailed description, with reference where appropriate to the accompanying drawings.

DETAILED DESCRIPTION

Figure 1:
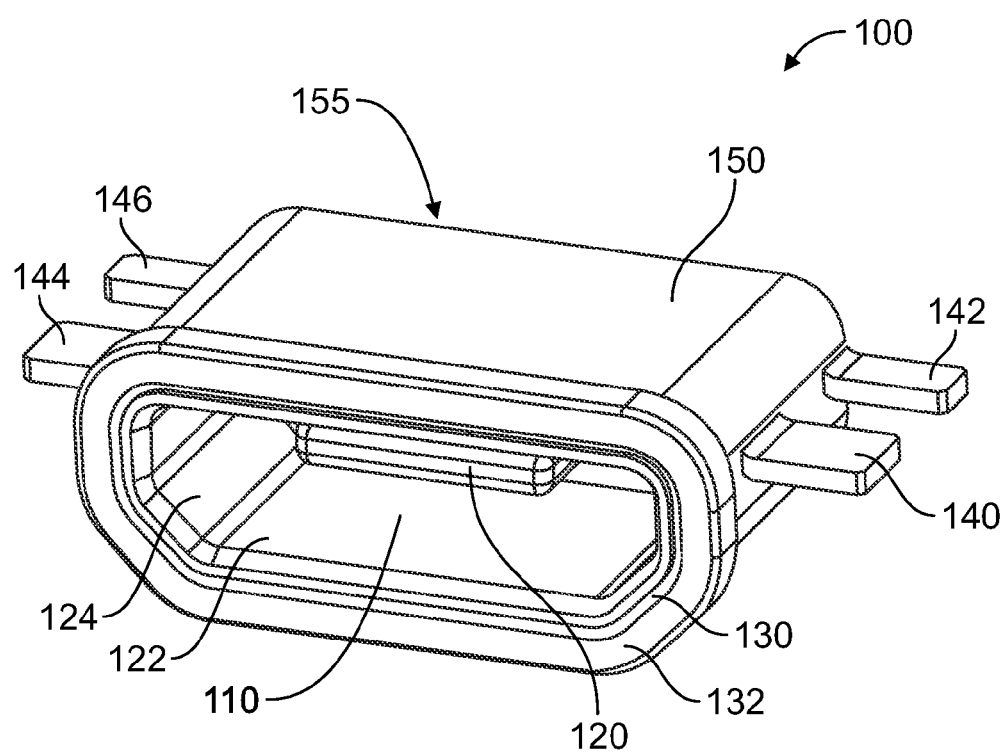
FIG. 1 is a perspective bottom view of waterproof micro-USB receptacle 100 having overmolded plastic layer 155, according to an example embodiment.

In the following detailed description, reference is made to the accompanying figures, which form a part hereof. In the figures, similar symbols typically identify similar components, unless context dictates otherwise. The illustrative embodiments described in the detailed description, figures, and claims are not meant to be limiting. Other embodiments may be utilized, and other changes may be made, without departing from the scope of the subject matter presented herein. It will be readily understood that the aspects of the present disclosure, as generally described herein, and illustrated in the figures, can be arranged, substituted, combined, separated, and designed in a wide variety of different configurations, all of which are explicitly contemplated herein.

Overview

A wearable device may be mounted to an external body surface, such as a wrist, leg, upper arm, or other location. For example, the wearable device may include a housing and a mount (e.g., a band) that can mount the housing on a particular external body surface.

In some embodiments, the wearable device may include one or more sensors that are operable by electronics within the wearable device to measure one or more physiological parameters of the wearer (e.g., via the external body surface). In one example, the one or more sensors could include a pair of electrical contacts for measuring a Galvanic skin resistance, which may be related to perspiration and, thus, the wearer's activity level, sympathetic nervous system activity, and/or emotional state/affect. The electrical contacts may protrude from a housing of the device so as to contact the wearer's skin. With the electrical contacts against the wearer's skin, electronics within the device may be used to measure an external resistance between the first and second electrical contacts. This external resistance is related to the wearer's Galvanic skin resistance. In another example, the one or more sensors may include a light source, such as a light emitting diode (LED), and a photodetector for measuring a pulse rate by photoplethysmography. In this approach, the light source transmits light through the skin into a portion of subsurface vasculature, and the photodetector measures the amount of light reflected from or transmitted through the subsurface vasculature. Electronics within the device may determine a pulse rate and/or other physiological parameters from the time variation of the photodetectors signal. Other examples of sensors and other examples of physiological parameters that may be measured by sensors in a wearable device are possible as well.

The electronics within the device may be powered by a rechargeable battery in the wearable device. The wearable device may further include a recharger for recharging the rechargeable battery. For example, the recharger may be connected to an external power source using a micro-USB receptacle positioned on the wearable device. In addition to wearable devices, micro-USB receptacles can also be used in other types of devices such as cell phones, cameras, head mounted displays, handheld computers, and tablet computers. Such devices may become immersed in water.

Figure 2:
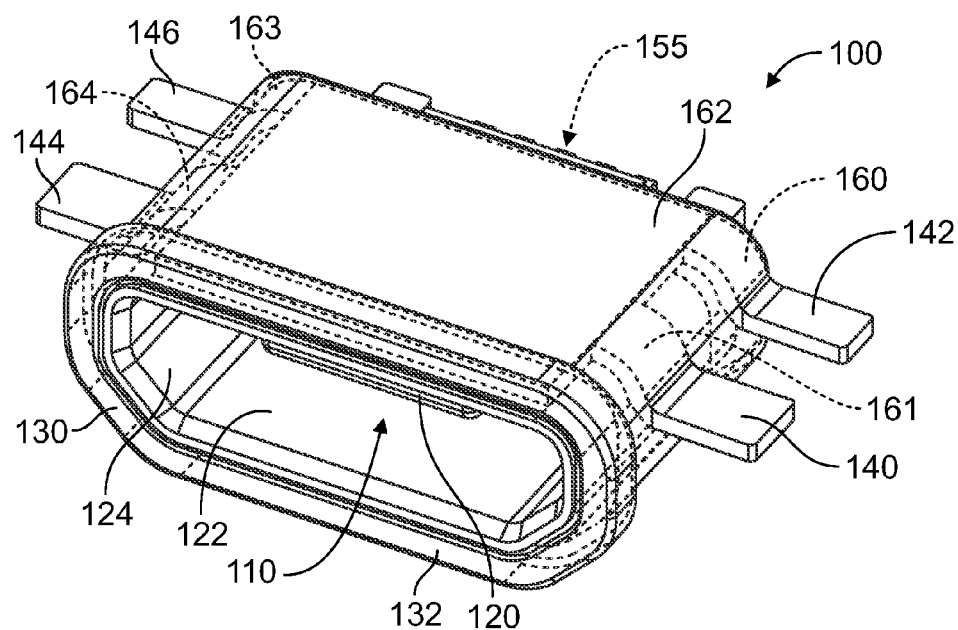
FIG. 2 is another perspective bottom view of waterproof micro-USB receptacle 100 shown in FIG. 1, with overmolded plastic layer 155 shown in a semi-transparent state.

Disclosed herein are structures and fabrication techniques that can provide a waterproof micro-USB receptacle. Conventional micro-USB receptacles are made from stamped sheet metal, and are then bent or formed into the shape of a receptacle. Gaps and holes may be present in the metal receptacle, providing a point of ingress for moisture, water, and/or dust or debris. The present embodiments are directed to a waterproof micro-USB receptacle that may be used in a wearable device or other type of device. In particular, as shown in FIGS. 1-7, a waterproof micro-USB receptacle is provided. FIG. 1 is a perspective bottom view of waterproof micro-USB receptacle 100 having overmolded layer 155, according to an example embodiment. FIG. 2 is another perspective bottom view of waterproof micro-USB receptacle 100 shown in FIG. 1, with overmolded upper layer 155 shown in a semi-transparent state.

In FIGS. 1 and 2, the waterproof micro-USB receptacle includes a connector pin array 120 shown positioned within receptacle cavity 110 that is surrounded and defined by metal shell 122. Metal shell 122 includes wall 124 that extends around the metal shell 122. To provide waterproof USB receptacle 100, as shown in FIG. 1, the metal shell 122 is overmolded with a plastic layer 155 having an upper layer 150, as well as a lower layer not shown. The overmolded layer 155 is shown covering the entire outer surface of the metal shell 122 to prevent moisture, water, or debris from entering the receptacle cavity 110 through any gaps or holes in metal shell 122. The metal shell 122 includes a front face 130, extending forwardly from the outer surface of the metal shell 122, which may be exposed, or may be covered with an overmolded layer of plastic.

The overmolded plastic layer 155 may include a front face 132 positioned about the periphery of front face 130 of metal shell 122. As discussed in more detail below with respect to FIGS. 6 and 7, the face 132 of the overmolded plastic layer 155 may serve as a sealing surface for a seal positioned between an inner surface of the housing of the wearable device or electronic device and the front face 132 of the overmolded plastic layer 155. The front face of the overmolded plastic layer 155 may extend above the front face 130 of the metal shell 122 about 0.8 mm, and also extend around the periphery the front face 130 of metal shell 122 a distance of about 0.8 mm.

Figure 3:
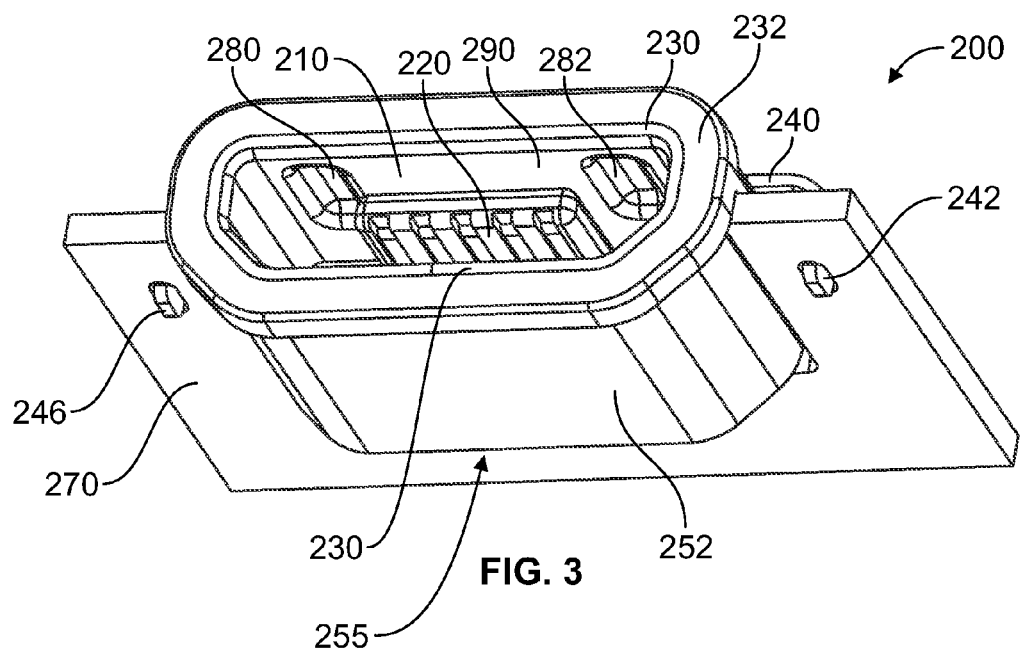
FIG. 3 is a perspective bottom front view of waterproof micro-USB receptacle 200, having an overmolded plastic layer 255, according to an example embodiment.

An upper surface of the metal shell 122 may include a pair of spaced retention notches (such as retention notches 280 and 282 shown in FIG. 3). Retention notches may be used to retain a micro-USB plug within receptacle cavity 110. In particular, a micro-USB plug may include a male member having a spaced apart pair of spring-loaded pins that correspond to the retention notches in the metal shell, that are used to retain the micro-USB plug within the micro-USB receptacle.

In a conventional micro-USB receptacle, during the formation of the retention notches, the retention notches may perforate the metal shell providing a further point of ingress for moisture, water, or debris. As shown in FIG. 2, a metal sheet 162 may be positioned over the surface of the metal shell 122 where the retention notches are positioned, and be secured thereto. The metal sheet 162 may be laser welded to the metal shell 122 to cover any points of ingress caused during the formation of the retention notches in the metal shell 122.

The entire metal shell 122 and metal sheet 162 are then overmolded with plastic layer 155 to prevent entry of moisture, water, or debris through the metal shell 122. In one embodiment, the metal shell 122 is overmolded with a liquid crystal polymer (LCP) plastic layer 155 which is a high temperature plastic. The metal sheet 162 may also advantageously conform to the outer surface of the metal shell 122 where metal sheet 162 extends downwardly to form exposed mounting arms 140, 142, 144, and 146. In particular, metal sheet 162 may include curved plastic-encased arm portions 160, 161, 163, and 164 that extend into exposed mounting arms 142, 140, 146, and 144 respectively. In this embodiment, a mid-mount configuration is provided. Exposed mounting arms 140, 142, 144, and 146 may also be configured to provide a bottom mount or a top mount configuration. Exposed mounting arms 140, 142, 144, and 146 may be used to secure the waterproof micro-USB receptacle 100 to a printed circuit board (not shown).

Figure 4:
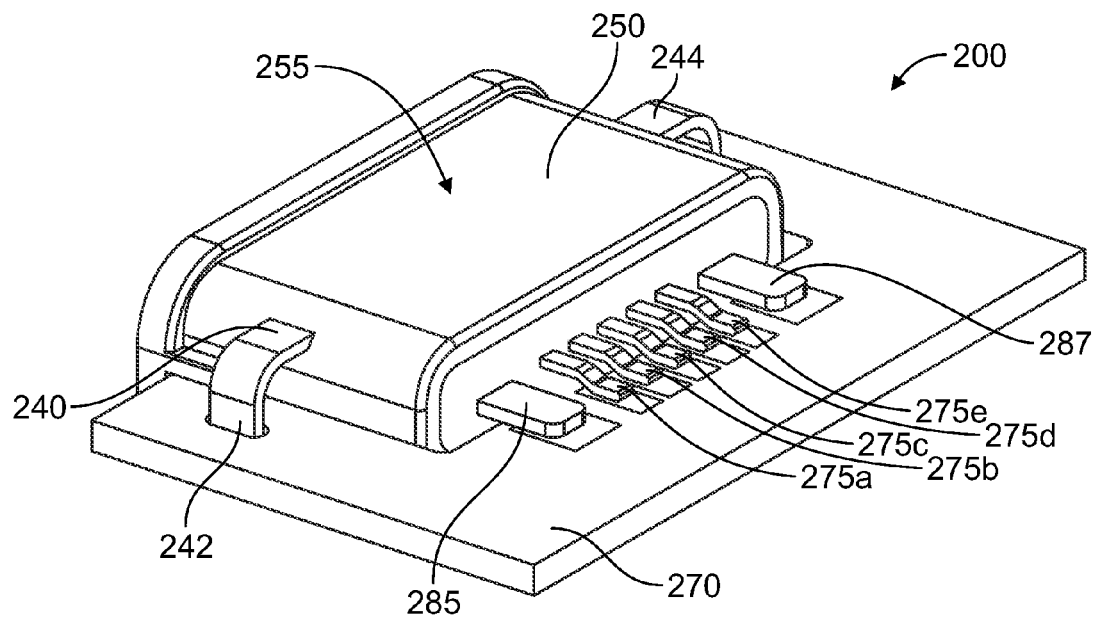
FIG. 4 is a perspective top rear view of waterproof micro-USB receptacle 200 shown in FIG. 3, mounted on circuit board 270, according to an example embodiment.
Figure 5:
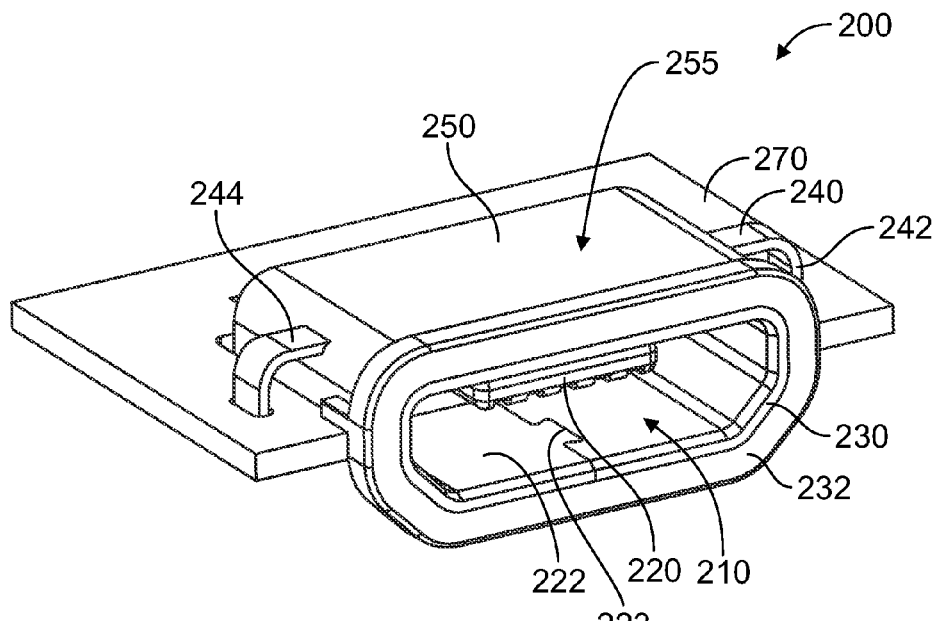
FIG. 5 is a perspective top front view of waterproof micro-USB receptacle 200 shown in FIG. 4.

FIGS. 3-5 are directed to waterproof micro-USB receptacle 200. As with the micro-USB receptacle 100 shown in FIGS. 1 and 2, micro-USB receptacle 200 similarly includes a connector pin array 220 shown positioned within receptacle cavity 210 that is surrounded and defined by metal shell 290. To provide waterproof micro-USB receptacle 200, the metal shell 290 is overmolded with a plastic layer 255 having a lower layer 252, as well as an upper overmolded layer 250 shown in FIGS. 4 and 5. The overmolded plastic layer 255 is shown covering the entire outer surface of the metal shell 290 to prevent moisture, water, or debris from entering the receptacle cavity 210 through any gaps or holes in metal shell 290. The metal shell 290 includes a front face 230, extending forwardly from the outer surface of metal shell 290, which may be exposed, or may be covered with an overmolded layer of plastic in some embodiments.

The overmolded plastic layer 255 may include a front face 232 positioned about the periphery of front face 230 of metal shell 290. As discussed in more detail below with respect to FIGS. 6 and 7, the front face 230 of metal shell 290 and front face 232 of the overmolded plastic layer 255 (or only the front face 232 of the overmolded plastic layer 255) may serve as a sealing surface for a seal positioned between an inner surface of the housing of the wearable device or electronic device and the front face 232 of the overmolded plastic layer 255.

An upper surface of the metal shell 290 may include a pair of spaced retention notches 280 and 282. Retention notches 280 and 282 may be used to retain a micro-USB plug within receptacle cavity 210. In particular, a micro-USB plug may include a male member having a spaced apart pair of spring-loaded pins that correspond to the retention notches 280 and 282 in the upper surface of metal shell 290 that serve to retain the micro-USB plug within the micro-USB receptacle.

As noted above, in a conventional micro-USB receptacle, during the formation of the retention notches in the metal shell, the retention notches may perforate the metal shell providing a further point of ingress for moisture, water, or debris. In a waterproof micro-USB receptacle design, such perforations are undesirable. As shown in FIG. 3, a forming process may be used to form wells in the upper surface of metal shell 290 that are retention notches 280 and 282, without perforating the metal shell 290. The forming process may simply provide indentations in the metal shell 290 to form retention notches 280 and 282. In this manner, retention notches 280 and 282 may be formed without perforating the metal shell 290 so that additional points of ingress for water, moisture, or debris are prevented, as the retention notches 280 and 282 are formed contiguous with the metal shell 290 without the formation of a hole or holes in the metal shell 290.

The entire metal shell 290 is then overmolded with plastic to encapsulate the metal shell 290 in overmolded plastic layer 255 and to prevent entry of moisture, water, or debris through the metal shell 290 into receptacle cavity 210. In one embodiment, the metal shell 290 is overmolded with a plastic layer 255 formed of a liquid crystal polymer (LCP) which is a high temperature plastic. A mounting arm may also be molded into the overmolded plastic layer 255. In particular, a mounting arm having extended mounting sections 240 and 244 may extend from the metal shell 290 having extending tabs 242 and 246 that may be positioned within apertures in circuit board 270 to secure the water proof micro-USB receptacle 200 to circuit board 270.

As shown in FIG. 4, connector pins 275a-e extend through a potted layer from a rear side of the waterproof micro-USB receptacle 200 where they may be electrically connected to circuit board 270. In addition, rear mounting lugs 285 and 287 are also shown extending on either side of the connector pins a-e and may advantageously be used to provide a surface mount on circuit board 270. As noted above, in the embodiment shown in FIGS. 3-5, the front mounting arms 240 and 244 having extending tabs 242 and 246 that may be positioned within apertures in the circuit board 270. However, the area of the circuit board 270 to the rear of the micro-USB receptacle 200 is near the signals and typically a high density area, where it is undesirable to provide holes for mounting the micro-USB receptacle because a hole in that region would block signals on all the layers, which isn't good for PCB layout. Therefore, providing rear mounting lugs 285 and 287 as surface mounts on the circuit board 270 eliminates the need to provide mounting holes in the circuit board in that region.

As shown in FIG. 5, a lower surface 222 of metal shell 290 may connect to another portion of metal shell 290 with jigsaw-like portion 223, where a gap may be formed in the metal shell 290. Overmolded plastic layer 255 serves to encapsulate the gap formed at jigsaw-like portion 223 to prevent the ingress of moisture, water or debris through that gap into the receptacle cavity 210.

Figure 6:
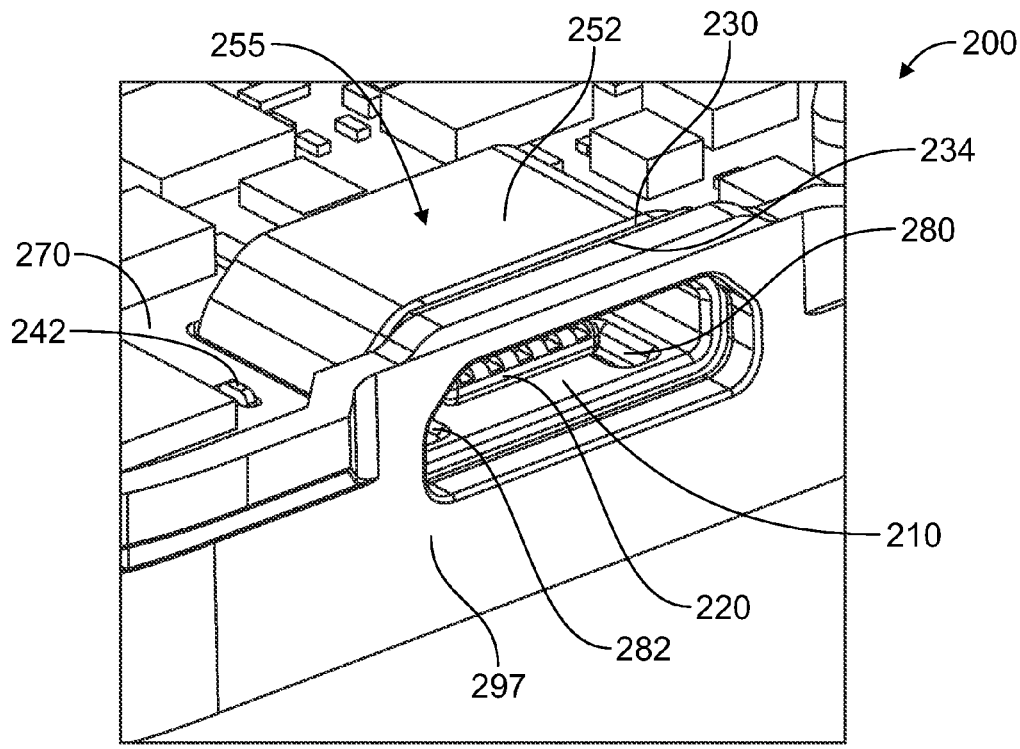
FIG. 6 is a top view front view of waterproof micro-USB receptacle 200 shown in FIGS. 3-5 positioned within a wearable device or electronic device with lower overmolded surface 252 positioned above receptacle cavity 210, according to an example embodiment.
Figure 7:
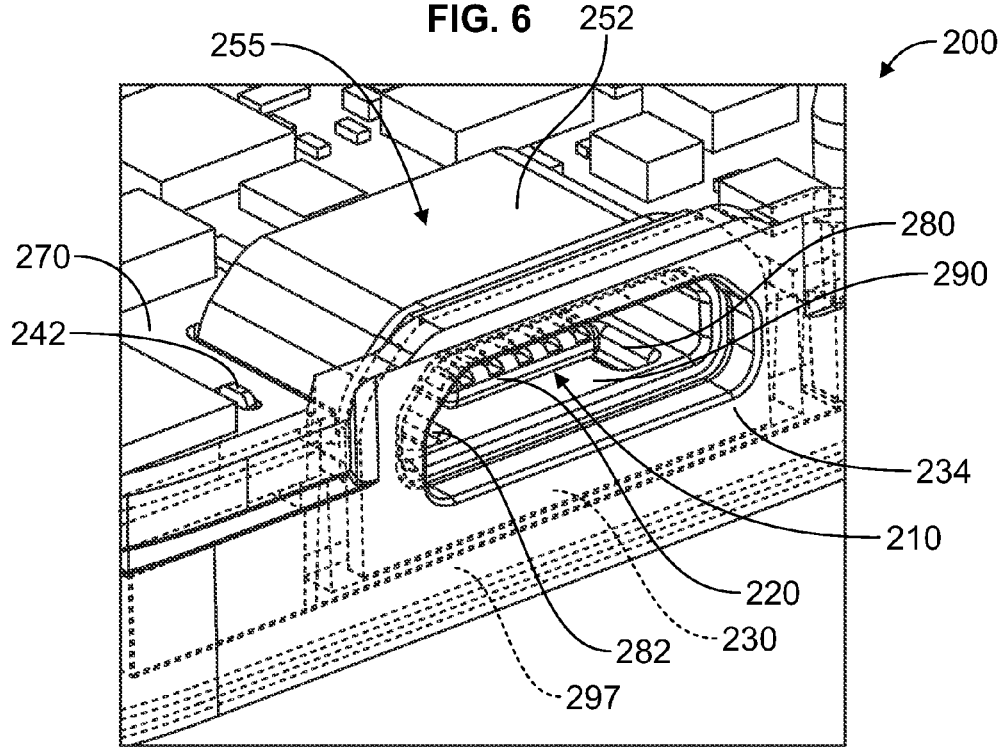
FIG. 7 is another top front view of waterproof micro-USB receptacle 200 shown in FIG. 6 with housing portion 297 shown in a semi-transparent state.

FIGS. 6 and 7 illustrate waterproof micro-USB receptacle 200 positioned on circuit board 270 of a wearable device or electronic device and secured with mounting arm 242 and 240 (not shown) to the circuit board 270. In this embodiment, the receptacle 200 includes retention notches 280 and 282 on a lower surface of the receptacle 200. Connector pin array 220 is positioned within receptacle cavity 210. Overmolded plastic layer 255 is shown with lower portion 252 positioned above the receptacle cavity 210. A seal 234 is shown positioned between an inner surface of the housing 297 of the wearable device or electronic device.

In FIG. 7, the housing 297 is shown in a semi-transparent state to provide a better view of seal 234 which is positioned between a front surface of housing 297 and the front surface 232 of overmolded plastic layer 255. The seal 234 may be formed of a double-sided adhesive. For example, a double-sided adhesive comprised of closed cell foam may be used that is available from Nittodenko having Part No. 57130. Other materials may also be used for the seal. In one embodiment, the sealing material used for the seal 234 may be nominally 0.4 mm thick. It is also possible that seal 234 is formed of a soft rubber seal, or an O-ring type seal.

Seal 234 shown in FIGS. 6 and 7 may also be used to provide a seal between an inner surface of a housing and the front surface 132 of overmolded plastic layer 155 shown in the waterproof micro-USB receptacle 100 shown in FIGS. 1 and 2.

The embodiments shown in waterproof micro-USB receptacles 100 and 200 shown in FIGS. 1-7 when using seal 234, provide a waterproof micro-USB receptacle having a rating of IPx7 or better. As used herein, a rating of IPx7 means that the micro-USB receptacle will prevent the ingress of water through the metal shell when immersed in one meter of water for 30 minutes. In addition, the embodiments shown in waterproof micro-USB receptacles 100 and 200 shown in FIGS. 1-7 when using seal 234, provide a micro-USB receptacle having a rating of IP67. As used herein, a rating of IP67 means that the micro-USB receptacle will prevent ingress of dust.

Figure 8:
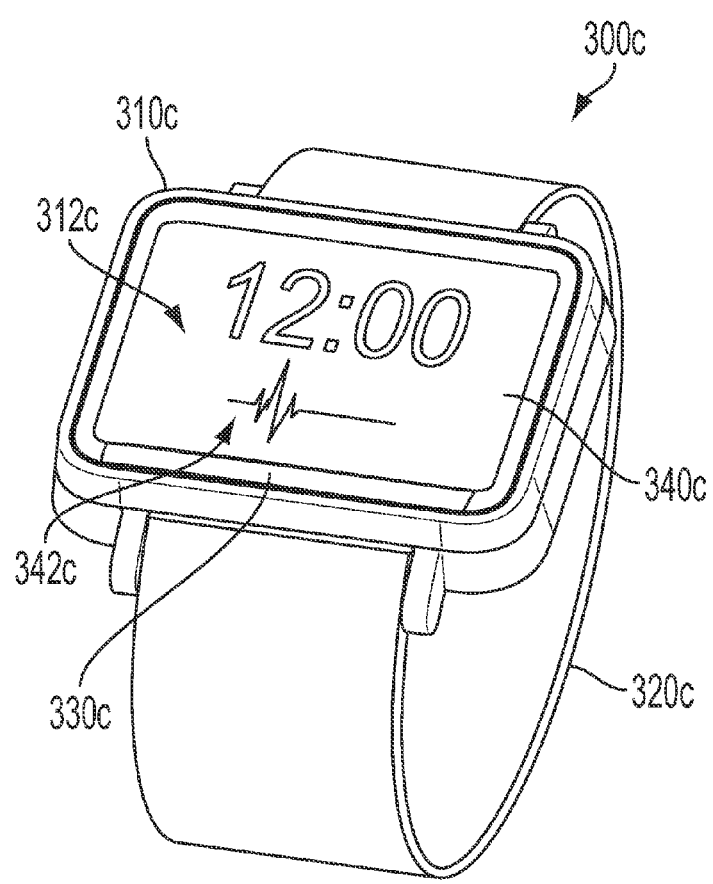
FIG. 8 is a perspective view of an example wearable device.

The waterproof micro-USB receptacles 100 and 200 shown in FIGS. 1-7 may be positioned in a wearable device such as wearable device 300c shown in FIG. 8. In this example, the wearable device 300c includes a user interface configured to present and/or indicate information to a wearer and/or to receive information (e.g., command inputs) from the wearer. For example, wearable device 300c may be configured to extract an ECG waveform from voltage fluctuations between skin at first and second external body surfaces, to make other physiological measurements. A housing 310c is disposed on a mount 320c such that the housing 310c can be positioned on a first external surface of a first arm of the body (e.g., a surface of a wrist of the body). The housing 310c has an outside surface 312c that is away from the first external surface of the body and an inside surface (not shown) that is toward and/or in contact with the first external surface of the body when the housing 310c is positioned on the first external surface of the body. A first electrical contact (not shown) is disposed on the inside surface of the housing 310c and a second electrical contact 330c is disposed on the outside surface 312c of the housing 310c. Further, the wearable device 300c includes a user interface 340c disposed on the outer surface 312c of the housing.

A wearer of the device 300c may receive one or more recommendations or alerts generated from a remote server or other remote computing device, or from a processor within the device via the user interface 340c. The alerts could be any indication that can be noticed by the person wearing the wearable device. For example, the alert could include a visual component (e.g., textual or graphical information on a display), an auditory component (e.g., an alarm sound), and/or tactile component (e.g., a vibration). Further, the user interface 340c may be configured and/or operated to provide a visual display 342c to provide an indication of a status of the device, a time, an extracted ECG waveform, or an indication of any other measured physiological parameters measured by the device 300c. Further, the user interface 340c may include one or more buttons and/or be configured as a touch screen for accepting inputs from the wearer. For example, user interface 340c may be configured to change the text or other visual information 342c in response to the wearer touching one or more locations of the user interface 340c.

Figure 9A:
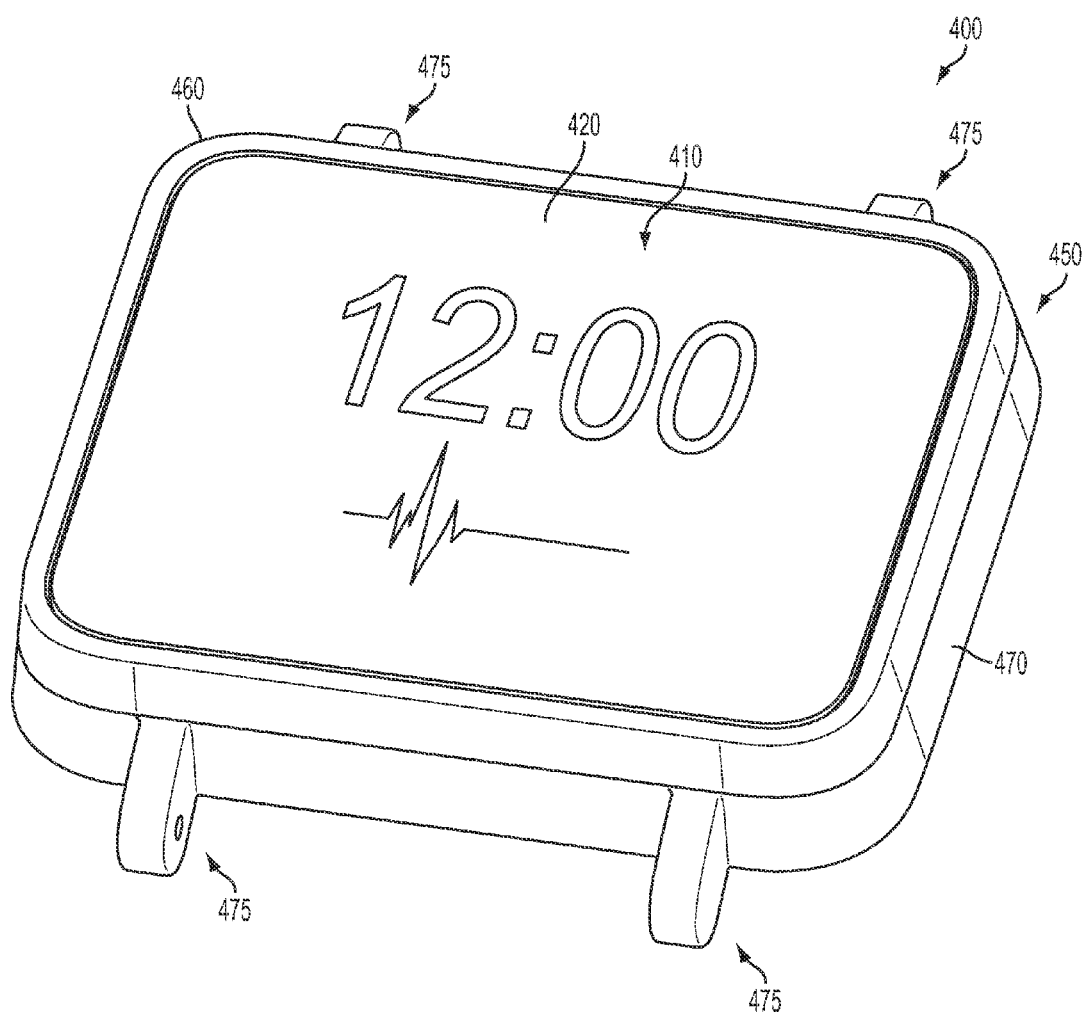
FIG. 9A is a top perspective view of elements of an example wearable device.

FIG. 9A illustrates a top perspective view of an example wearable device 400 including a central housing 410 configured to be removably seated in a frame 450 of a modular mount. The modular mount additionally includes a band (not shown) connected to the frame 450 and configured to mount the central housing 410 to an external body surface (e.g., a wrist) of a wearer. The central housing 410 includes a user interface 420 disposed on an outer surface of the central housing 410 (e.g., a surface opposite the external body surface when the central housing 410 is mounted to the external body surface by the modular mount). The user interface 420 is a touchscreen interface, configured to present visual indications to a wearer (e.g., by spatially modulating an emitted light of the user interface 420 and/or by spatially modulating a reflectivity of the user interface 420). The frame 450 includes a nonconductive inner portion 470 and a conductive outer portion 460. The outer portion 460 is configured to act as an electrical contact and to contact skin of an external body surface of the wearer (e.g., skin of a finger of the wearer). The outer portion 460 encircles the user interface 420 when the central housing 410 is seated in the frame 450 (as shown in FIG. 4A). The inner portion 470 of the frame 450 includes mounting points 475 configured to attach a band, strap, or other means of securing the wearable device 400 to an external body surface (e.g., the mounting points 475 could be configured to attach to a standard watch band, i.e., they could be approximately 26 millimeters apart, 20 millimeters apart, or some other distance apart according to a stand watch band size).

Figure 9B:
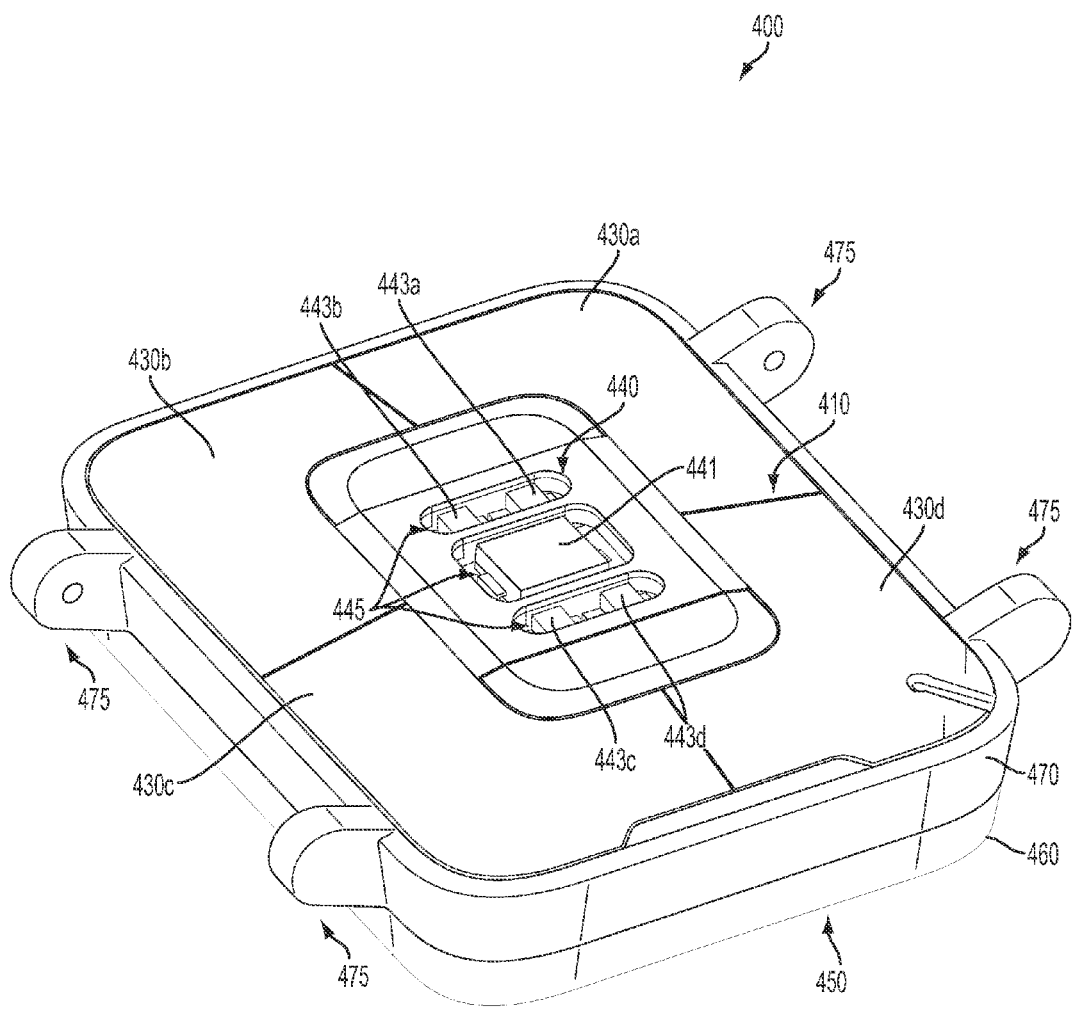
FIG. 9B is a bottom perspective view of the elements of the example wearable device illustrated in FIG. 9A.

FIG. 9B illustrates a bottom perspective view of the wearable device 400 illustrating elements disposed on an inside surface of the central housing 410 (i.e., elements disposed toward the external body surface when the central housing 410 is mounted to the external body surface by the modular mount). A plurality of electrical contacts 430a, 430b, 430c, 430d are disposed on the inside surface of the central housing 410. The plurality of electrical contacts 430a, 430b, 430c, 430d could be configured to enable a variety of applications of the wearable device 400. For example, pairs of the electrical contacts 430a, 430b, 430c, 430d could be operated to detect a skin resistance, a skin capacitance, a Galvanic skin response, a body water content, a body fat content, or other information by passing a current through and/or applying a voltage to skin proximate to the wearable device and detecting a corresponding voltage across and/or current through the pairs of the electrical contacts 430a, 430b, 430c, 430d. Further, a Galvanic skin voltage, an EMG waveform, or some other electrophysiological voltage signal could be detected through two or more of the electrical contacts 430a, 430b, 430c, 430d. In some examples, an electro-haptic stimulus could be delivered to a wearer though two or more of the electrical contacts 430a, 430b, 430c, 430d. In some examples, a temperature sensor could be thermally coupled to one or more of the electrical contacts 430a, 430b, 430c, 430d to enable the detection of the temperature of skin proximate to the one or more electrical contacts 430a, 430b, 430c, 430d.

The central housing 410 additionally includes an optical sensor 440. The optical sensor 440 includes a photodetector 441 and four light sources 443a, 443b, 443c, 443d. The photodetector 441 and light sources 443a, 443b, 443c, 443d are disposed behind protective windows 445. The four light sources 443a, 443b, 443c, 443d could be similarly or differently configured. The photodetector could be any element configured to electronically detect one or more properties (e.g., wavelength, spectral profile, amplitude, amplitude within a specified range of wavelengths) of received light (e.g., a photodiode, a phototransistor, a photoresistor, an avalanche photodiode). The four light sources 443a, 443b, 443c, 443d could include LEDs, laser, or other elements configured to emit light. Further, the four light sources 443a, 443b, 443c, 443d could be configured to emit light having one or more specified properties (e.g., a specified wavelength, a specified amplitude, a specified waveform over time, a specified pulse or other timing). The optical sensor 440 could be configured to illuminate target tissues (e.g., using the light sources 443a, 443b, 443c, 443d) and to detect light responsively or otherwise emitted from the target tissue (e.g., using the photodetector 441) to detect one or more properties of the target tissue.

Figure 9C:
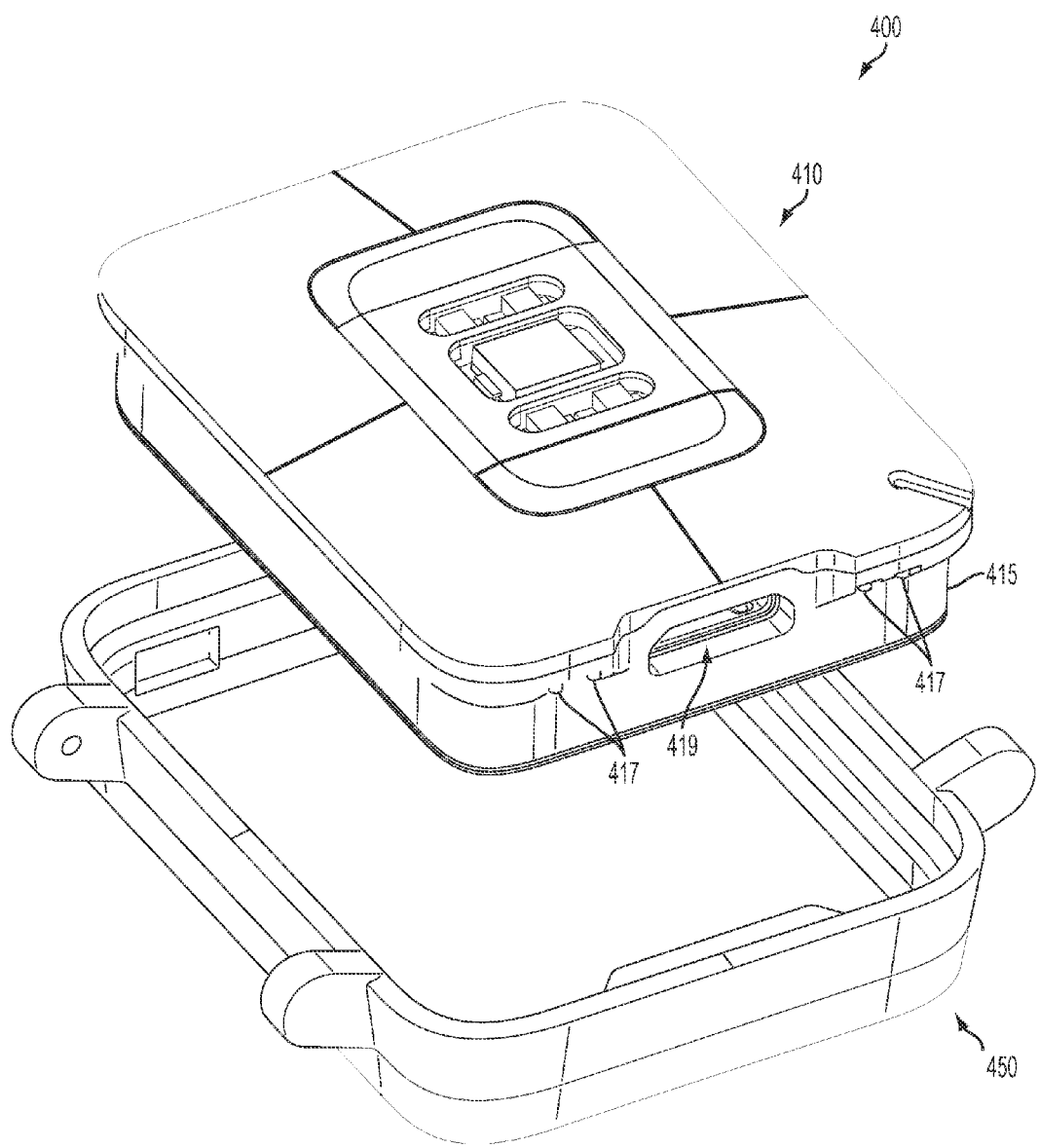
FIG. 9C is a bottom perspective view of the elements of the example wearable device illustrated in FIG. 9A, when a housing and a frame of the elements are disengaged from each other.

FIG. 9C illustrates a bottom perspective view of the wearable device 400 when the central housing 410 has been unseated from the frame 450. FIG. 9C illustrates a nonconductive housing 415, a wired interface 419, and contact pads 417 of the central housing. The wired interface 419 could be any interface configured to receive one or more conductors configured, e.g., as a connector such that power and electronic signals may be transmitted to and/or received from electronics disposed in the central housing 410. For example, the wired interface 419 could be a micro-USB interface that takes the form of waterproof micro-USB receptacles 100 and 200 shown in FIGS. 1-7 above. The contact pads 417 are configured to allow electrical contacts between electronics of the central housing 410 and electronics or other elements of a modular frame (e.g., the conductive electrical contact formed by the outer portion 460 of the frame 450).

CONCLUSION

Where example embodiments involve information related to a person or a device of a person, the embodiments should be understood to include privacy controls. Such privacy controls include, at least, anonymization of device identifiers, transparency and user controls, including functionality that would enable users to modify or delete information relating to the user's use of a product.

Further, in situations in where embodiments discussed herein collect personal information about users, or may make use of personal information, the users may be provided with an opportunity to control whether programs or features collect user information (e.g., information about a user's medical history, social network, social actions or activities, profession, a user's preferences, or a user's current location), or to control whether and/or how to receive content from the content server that may be more relevant to the user. In addition, certain data may be treated in one or more ways before it is stored or used, so that personally identifiable information is removed. For example, a user's identity may be treated so that no personally identifiable information can be determined for the user, or a user's geographic location may be generalized where location information is obtained (such as to a city, ZIP code, or state level), so that a particular location of a user cannot be determined. Thus, the user may have control over how information is collected about the user and used by a content server.

The particular arrangements shown in the Figures should not be viewed as limiting. It should be understood that other embodiments may include more or less of each element shown in a given Figure. Further, some of the illustrated elements may be combined or omitted. Yet further, an exemplary embodiment may include elements that are not illustrated in the Figures.

Additionally, while various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims. Other embodiments may be utilized, and other changes may be made, without departing from the spirit or scope of the subject matter presented herein. It will be readily understood that the aspects of the present disclosure, as generally described herein, and illustrated in the figures, can be arranged, substituted, combined, separated, and designed in a wide variety of different configurations, all of which are contemplated herein.

What is claimed is:

1. A wearable device, comprising:
  a housing;
  a rechargeable battery disposed within the housing;
  a mount configured to mount the housing to an external body surface;
  one or more sensors positioned in the housing and configured to measure one or more physiological parameters via the external body surface;
  a micro-USB receptacle positioned in the housing; and
  electronics disposed in the housing, wherein the electronics comprises a recharger configured to recharge the rechargeable battery, wherein the recharger is configured to be powered through the micro-USB receptacle;
  wherein the micro-USB receptacle comprises:
    a metal shell having an exterior surface and a front face extending forwardly from the exterior surface of the metal shell;
    a layer of plastic overmolded onto the exterior surface of the metal shell;
    a front face in the layer of plastic that extends around a periphery of the front face of the metal shell; and
    a seal positioned between the front face of the layer of plastic and an inner surface of the housing.

2. The wearable device of claim 1, wherein the seal comprises a waterproof, double-sided adhesive.

3. The wearable device of claim 1, wherein the seal comprises a compressible rubber.

4. The wearable device of claim 2, wherein the adhesive comprises a closed cell foam.

5. The wearable device of claim 1, wherein the metal housing is a stamped metal housing.

6. The wearable device of claim 1, wherein the layer of plastic comprises a liquid crystal polymer.

7. The wearable device of claim 1, wherein a pair of spaced apart retention notches are formed on an inner surface of the metal shell and are contiguous with the inner surface of the metal shell.

8. The wearable device of claim 7, wherein the pair of spaced apart retention notches are adapted to receive a corresponding pair of spring loaded members positioned on an outer surface of a micro-USB plug to retain the micro-USB plug within the micro-USB receptacle.

9. The wearable device of claim 1, wherein a pair of spaced apart retention notches are positioned on an inner surface of the metal shell, and a metal plate is secured over an outer surface of the metal shell containing the retention notches to create a seal between the outer surface of the metal shell and the metal plate.

10. The wearable device of claim 9, wherein the metal plate is laser welded to the bottom surface of the metal shell.

11. The wearable device of claim 9, wherein one or more retention arms are positioned on the metal plate for securing the micro-USB receptacle within the housing of the wearable device.

12. The wearable device of claim 1, wherein a retention arm is positioned within the plastic for securing the micro-USB receptacle within the housing of the wearable device.

13. The wearable device of claim 1, wherein the micro-USB receptacle has an IPx7 rating.

14. A device, comprising:
  a housing;
  a rechargeable battery disposed within the housing;
  a micro-USB receptacle positioned in the housing;
  a recharger disposed in the housing and configured to recharge the rechargeable battery,
  wherein the recharger is configured to be powered through the micro-USB receptacle;
  wherein the micro-USB receptacle comprises:
    a metal shell having an exterior surface and a front face extending forwardly from the exterior surface of the metal shell;
    a layer of plastic overmolded onto the exterior surface of the metal shell;
    a front face in the layer of plastic that extends around a periphery of the front face of the metal shell; and
    a seal positioned between the front face of the layer of plastic and an inner surface of the housing.

15. The device of claim 14, wherein the seal comprises a waterproof, double-sided adhesive.

16. The device of claim 15, wherein the adhesive comprises a closed-cell foam.

17. The device of claim 14, wherein a pair of spaced apart retention notches are formed on an inner surface of the metal shell and are contiguous with the inner surface of the metal shell, and wherein the pair of spaced apart retention notches are adapted to receive a corresponding pair of spring loaded members positioned on an outer surface of a micro-USB plug to retain the micro-USB plug within the micro-USB receptacle.

18. The device of claim 14, wherein a pair of spaced apart retention notches are positioned on an inner surface of the metal shell, and a metal plate is laser welded over an outer surface of the metal shell containing the retention notches to create a seal between the outer surface of the metal shell and the metal plate.

19. The electronic device of claim 18, wherein one or more retention arms are positioned on the metal plate for securing the micro-USB receptacle within the housing of the wearable device.

20. The electronic device of claim 14, wherein a retention arm is positioned within the plastic for securing the micro-USB receptacle within the housing of the wearable device.

21. The electronic device of claim 14, wherein a pair of retention arms extend from first and second sides of the metal shell and each retention arm includes an extending portion configured to be placed within an aperture in a circuit board within the housing, and wherein a pair of mounting lugs extend from a rear of the micro-USB receptacle and each rear mounting lug is configured to mount to a surface of the circuit board within the housing used for securing the micro-USB receptacle to the circuit board within the housing.

22. The electronic device of claim 14, wherein the micro-USB receptacle has an IP67 rating.

23. The electronic device of claim 14, wherein the micro-USB receptacle has an IPx7 rating.

* * * * *